United States Patent [19]

Bernhardt et al.

[11] Patent Number: 5,256,565
[45] Date of Patent: Oct. 26, 1993

[54] ELECTROCHEMICAL PLANARIZATION

[75] Inventors: Anthony F. Bernhardt, Berkeley; Robert J. Contolini, Pleasanton, both of Calif.

[73] Assignee: The United States of America as represented by the United States Department of Energy, Washington, D.C.

[21] Appl. No.: 348,982

[22] Filed: May 8, 1989

[51] Int. Cl.⁵ .......................................... H01L 21/465
[52] U.S. Cl. ..................... 437/228; 437/203; 437/230; 437/245; 437/170; 437/187; 437/194
[58] Field of Search ............... 437/228, 203, 230, 245, 437/170, 187, 194; 156/664, 665, 666; 204/129.1, 129.46, 129.43, 129.35

[56] References Cited

U.S. PATENT DOCUMENTS

| | | | |
|---|---|---|---|
| 3,849,270 | 11/1974 | Takagi et al. | 204/129.1 |
| 4,462,856 | 7/1984 | Abe et al. | 156/665 |
| 4,475,983 | 10/1984 | Bader et al. | 156/667 |
| 4,624,749 | 11/1986 | Black et al. | 205/123 |
| 4,674,176 | 6/1987 | Tuckerman | 437/173 |
| 4,681,795 | 7/1987 | Tuckerman | 427/53.1 |
| 4,692,349 | 9/1987 | Georgiou et al. | 437/230 |
| 4,696,729 | 9/1987 | Santini | 204/273 |
| 4,729,940 | 3/1988 | Nee et al. | 204/129.6 |
| 4,789,648 | 12/1988 | Chow et al. | 437/245 |
| 4,808,545 | 2/1989 | Balasubramanyam et al. | 437/192 |
| 4,855,252 | 8/1989 | Peterman et al. | 437/228 |
| 4,874,493 | 10/1989 | Pan | 437/228 |
| 4,876,223 | 10/1989 | Yoda et al. | 437/228 |
| 4,915,983 | 4/1990 | Lake et al. | 156/643 |
| 4,944,836 | 7/1990 | Beyer et al. | 156/665 |
| 5,096,550 | 3/1992 | Mayer et al. | 204/129.1 |

*Primary Examiner*—Brian E. Hearn
*Assistant Examiner*—Trung Dang
*Attorney, Agent, or Firm*—Henry P. Sartorio; Roger S. Gaither; William R. Moser

[57] ABSTRACT

In a process for fabricating planarized thin film metal interconnects for integrated circuit structures, a planarized metal layer is etched back to the underlying dielectric layer by electropolishing, ion milling or other procedure. Electropolishing reduces processing time from hours to minutes and allows batch processing of multiple wafers. The etched back planarized thin film interconnect is flush with the dielectric layer.

12 Claims, 4 Drawing Sheets

PATTERN

METALIZE

PLANARIZE

ETCH BACK

ELECTROCHEMICAL PLANARIZATION

The U.S. Government has rights in this invention pursuant to Contract No. W-7405-ENG-48 between the U.S. Department of Energy and the University of California, for the operation of Lawrence Livermore National Laboratory.

BACKGROUND OF THE INVENTION

The invention relates generally to planarized interconnects for integrated circuit structures and more particularly to the formation of fully planarized interconnects.

U.S. Pat. Nos. 4,674,176 and 4,681,795 to Tuckerman describe thin film metal layer planarization processes for multilevel interconnect. In the fabrication of multilevel integrated circuit structures, the planarization of each metal layer eliminates irregular and discontinuous conditions between successive layers, particularly where vias are located.

The metal layer is planarized by heating for a brief, controlled time related to the spatial period of the features to be planarized. The entire planarization process, for forming the planarized interconnect, includes forming a thin film metal layer on a dielectric layer, and briefly heating the metal layer to produce a flat surface on the metal layer. An additional dielectric layer can then be deposited and the process repeated as many times as necessary to produce the required number of levels. However, in order to achieve fully planar multilevel interconnects, it is still necessary to planarize the dielectric layer.

Thus it is desirable to develop a planarization process in which dielectric planarization is unnecessary. This can be achieved by fabricating planarized metal interconnects which are flush with the dielectric layers. It is also desirable to develop a process in which further processing time is rapid and in which multiple interconnects can be processed simultaneously in a batch process.

A disadvantage of the planarization process, disclosed in U.S. Pat. Nos. 4,674,176 and 4,681,795, using pulsed laser or other heating, is the requirement of additional equipment and processing steps. It may be advantageous, in some circumstances, to form planarized structures without using the additional planarization apparatus or processing and/or without the associated heating, which may have a detrimental affect on various dielectric and other materials. Thus, it would be desirable to develop a process to form planarized circuit structures which eliminates the need for a separate planarization step for the metal layers, and which, in particular, eliminates the need for laser heating.

SUMMARY OF THE INVENTION

Accordingly, it is an object of the invention to provide an improved method of forming a thin film planarized metal interconnect which does not require any dielectric planarization.

It is also an object of the invention to provide an improved planarization process which is very rapid and might also be modified to process multiple wafers simultaneously.

It is another object of the invention to provide an improved thin film planarized metal interconnect.

It is a further object of the invention to provide an improved thin film planarized metal interconnect which is flush with the surrounding dielectric layer.

It is another objective of the invention to provide an improved method of forming a thin film planarized metal interconnect which does not require any pulsed laser or other heating steps to planarize the metal layers.

The invention is a method of fabricating planarized thin film metal interconnects in which the planarized metal layer is etched back to the surrounding dielectric layer, preferably by electropolishing; the invention also includes the resulting etched back planarized interconnect. A dielectric layer is first patterned or etched to form either a trench for the metal interconnect or a via to an underlying metal layer or a combination of a trench and a via, and then metallized or coated with an adhesion layer (if necessary) and a metal layer which, to some extent, follows the surface contours of the etched dielectric layer. The metal layer is then planarized to form a metal layer with a substantially flat surface which fills the trench and extends over the dielectric layer. Alternatively, the metal layer can be formed and planarized in a single step by forming, using an isotropic or other self-planarizing process, the metal layer on the etched dielectric layer, with a depth greater than or equal to about half the width of the widest feature in the dielectric layer to be filled. The flat metal layer is then etched back to the level of the dielectric layer by electropolishing or ion milling or other etchback techniques, leaving a metal interconnect with a flat surface filling the trench or via and flush with the dielectric surface. The electropolishing might be carried out rapidly in a batch process in which a plurality of wafers on which planarized metal layers have been formed are electrically connected to a voltage source and placed in an electropolishing solution. In addition to performing the etchback, the electropolishing may also further planarize the metal layer. The etchback can be performed in minutes by electropolishing.

DETAILED DESCRIPTION OF PREFERRED EMBODIMENTS

Figure 1A:
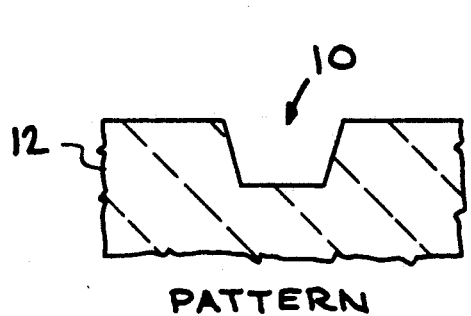
FIGS. 1A-D illustrate a process for forming a planarized metal layer for an interconnect, including etching back the planarized layer.

A method for fabricating planarized thin film metal interconnects for integrated circuits, and the resulting structures, is illustrated in FIGS. 1A-D. A trench or via 10 is etched or otherwise formed in a dielectric layer 12, typically made of $SiO_2$, of a circuit structure, at the location where a metal interconnect is to be formed. The etched or patterned dielectric layer 12, including trench 10, is then coated by conventional methods such as sputtering with an adhesion layer 15 (if necessary), followed by a metal layer 14 which substantially follows the surface contours of the etched dielectric layer and fills the trench. The metal layer is typically about 1 to 5 microns thick and made of gold, copper, silver, or aluminum. The adhesion layer is typically titanium or chromium. Metal layer 14 is then planarized, e.g. by pulsed laser pulses, to form a substantially flat metal layer 16 which completely fills the trench and extends over the dielectric layer. The planarization step is performed by controlled heating and melting of the metal layer, using lasers or other pulsed energy sources, for a time related to the spatial period of the features being planarized, as further described in U.S. Pat. Nos. 4,674,176 and 4,681,795, which are herein incorporated by reference.

In order to remove the metal above the dielectric layer so that the metal interconnect is flush with the surface of the dielectric layer, the planarized metal layer 16 is etched back to the dielectric layer to form an etched back thin film metal interconnect 18. In a preferred embodiment of the invention, the etchback is performed by electropolishing. The metal layer to be etched back is made the anode in an electric circuit. The metal is placed in an electrolytic bath and an electric current is run through the bath to cause anodic dissolution of the metal layer. The etchback step can also be performed by ion milling or other processes. However, the ion milling etchback step is very time consuming, often greater than one hour per wafer. Also only one wafer can generally be processed at a time by ion milling.

Figure 1B:
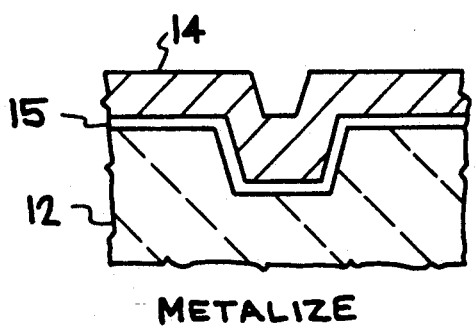
Figure 1C:
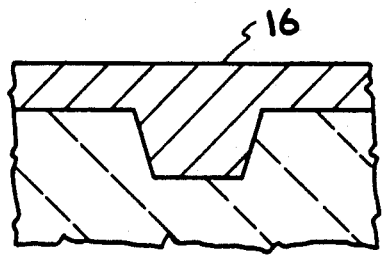
Figure 1D:
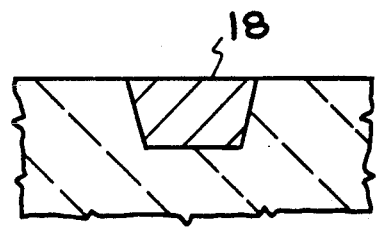
Figure 4A:
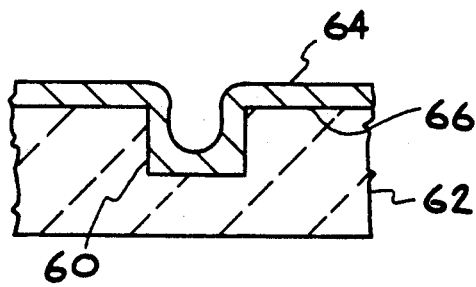
FIGS. 4A-C illustrate an alternative process for forming a planarized metal,layer for an interconnect.
Figure 4B:
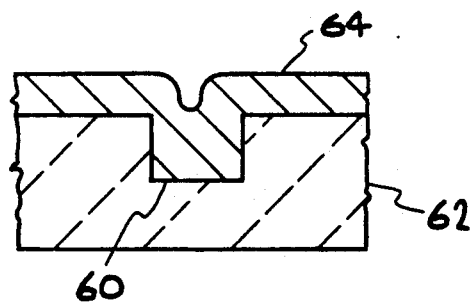
Figure 4C:
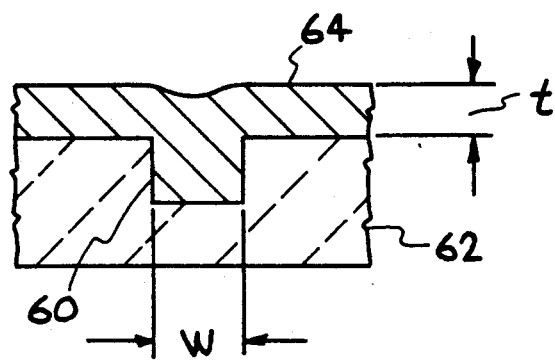

An alternate method of forming a planarized metal layer is illustrated in FIGS. 4A–C; this method can be carried out between the dielectric patterning step of FIG. 1A and the etchback step of FIG. 1D, and eliminates the need for the separate metalization and planarization steps of FIGS. 1B and C. After the desired features, e.g., trench 60, have been patterned in a dielectric layer 62, a metal layer 64 is deposited on the patterned dielectric layer by an isotropic or substantially isotropic or other self-planarizing deposition process, e.g., electroplating, electroless plating, or, in some cases, bias sputtering, to a depth t (measured from the surface of the dielectric layer) which is at least about half the width w of the widest feature in the dielectric layer which is to be filled with metal. Since the deposition process is isotropic or self-planarizing, the width of the features decreases at twice the rate that metal is added to the surface, so the trench closes when approximately half the initial width of the trench has been deposited. FIGS. 4A–C show the deposition process at an initial, intermediate and final stage, as metal layer 64 is built up to a sufficient thickness to produce a substantially flat surface. The planarized metal layer 64 is then etched back as before, preferably by electropolishing which tends to further smooth the surface while etching rapidly.

In order to perform the deposition to produce a flat layer, it may be necessary to deposit a seed layer 66 in order to electroplate if substrate (dielectric) 62 is not suitable for electroplating. Also, it is preferable to stop electropolishing just before all metal is totally removed from the dielectric layer and then remove any residual metal by ion milling. In place of a seed layer, a seed bilayer may also be used consisting of a bottom layer of conducting material on which electroplating and electropolishing do not occur and a top layer of another conducting material on which electroplating and electropolishing do occur. For example, to form a copper layer, a seed bilayer of 400A Cr and 2000A Cu could be used. A Cu layer can then be deposited on the Cu seed layer, and all the Cu on the dielectric removed by electropolishing. If this removes some Cu from the trench, then it can be plated back up without plating any Cu outside the trench since it does not plate to the exposed Cr. The Cr can then be removed, e.g., by ion milling.

Typical features may be about 10 micron in width. The method can be used to form planarized layers of copper, gold, silver, nickel, zinc, chromium and other metals.

To form multilevel interconnects, an additional layer of dielectric is formed over the structure of FIG. 1D and the process is repeated.

Although the invention has been described with respect to planarizing and etching back a metal interconnect in a trench formed in a dielectric layer, the invention is also applicable to the formation of interconnects through vias (holes) extending through a dielectric layer to an underlying metal layer, or to a combination of a trench with vias extending therefrom to an underlying metal layer. In each case, the dielectric layer is first patterned with the appropriate trenches, vias, or combinations thereof; the patterned dielectric layer is then metallized, planarized, and etched back to form the interconnect.

Figure 2:
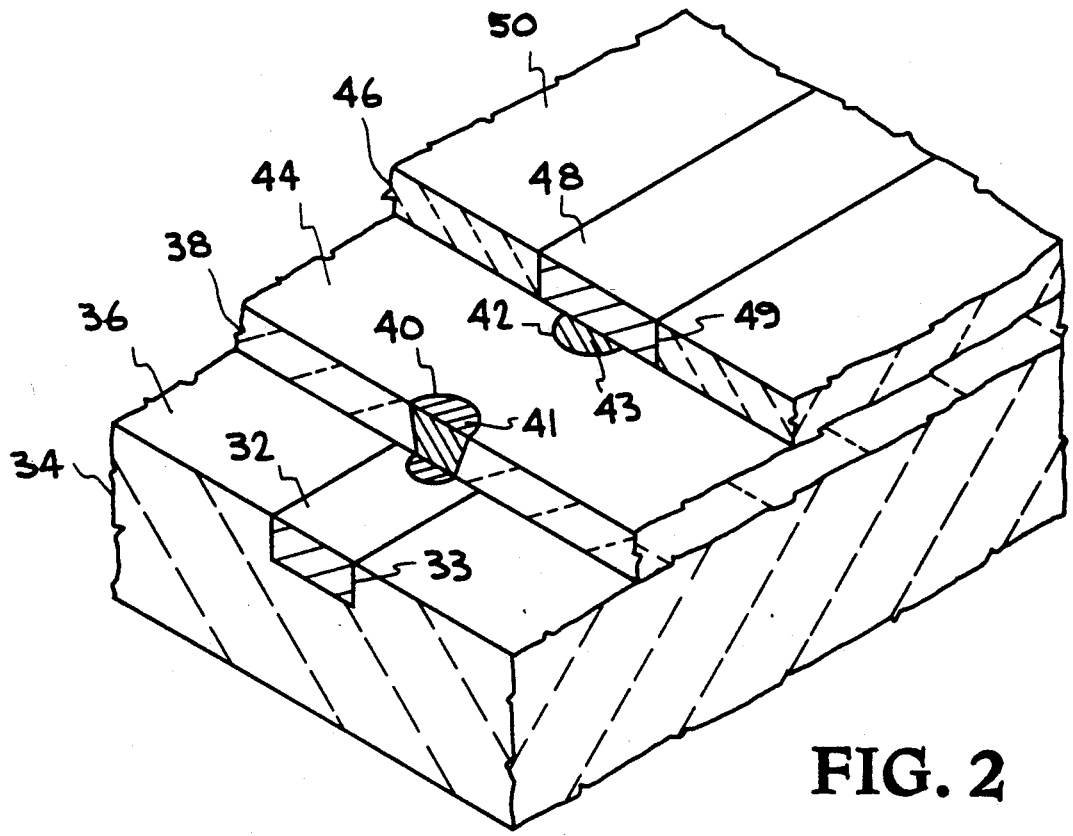
FIG. 2 is a perspective cutaway view of a planarized etched back interconnect structure formed with trenches, vias, and combinations thereof.

The various types of interconnect structures are illustrated in FIG. 2. A trench 33 is formed in a dielectric layer 34. Dielectric layer 34, including trench 33, are then coated with metal, which is then planarized and etched back to the surface 36 of dielectric layer 34, forming a metal interconnect 32 in trench 33 which is flush with the surface 36 of dielectric layer 34. An additional dielectric layer 38 is formed on layer 34 and vias 40, 42 are formed through dielectric layer 38 to underlying metal interconnect 32; the dielectric layer 38, including vias 40, 42, are then metallized. The metallization is planarized and etched back to the surface 44 of dielectric layer 38, forming solid plugs of metal 41, 43, respectively, within vias 40, 42 which are flush with the surface 44. Another dielectric layer 46 with a trench 49 is formed on dielectric layer 38, and a metal layer is deposited, planarized, and etched back to form an interconnect 48 in trench 49 which is flush with the surface 50 and which contacts plugs 41, 43 in vias 40, 42. Dielectric layers 38, 46 may be formed as a single layer on dielectric layer 34, and the single layer patterned with a trench 49 extending partly through the single dielectric layer (corresponding to upper layer 46) and with vias 40, 42 from the trench 49 to the underlying metal interconnect 32. The combination trench and vias are then metallized in a single operation, and the metal interconnect is planarized and etched back to upper surface 50.

Figure 3:
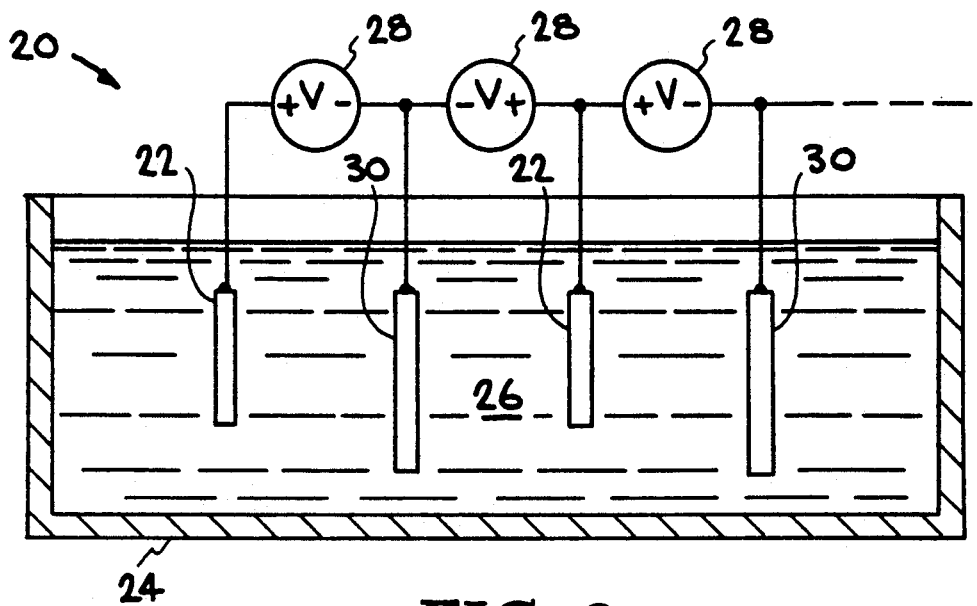
FIG. 3 illustrates an electropolishing apparatus for performing etchback of wafers with planarized metal layers.

An electropolishing apparatus 20 for carrying out the etchback of planarized metal layers on wafers in a batch process is illustrated in FIG. 3. A plurality of wafers 22 are placed in a tank 24 filled with electropolishing solution (electrolyte) 26 and connected to the positive terminal (anode) of an applied DC voltage source 28 while electrodes 30, which resist chemical interaction with the electrolyte, e.g. carbon, are connected to the negative terminals. The electrolyte is often an acid. Source 28 produces the required current density for the particular metal. Gold, silver, copper and aluminum can all be electropolished. The electropolishing performs not only the etchback step but in some cases may further planarize the metal layer if the initial planarization was incomplete. The operator halts the electropolishing as soon as the metal is removed from the main (non-trenched) areas of the dielectric layers, leaving only an adhesion layer (if present) on the main areas. This adhesion layer may be removed by wet chemical etching or ion milling. The remaining metal interconnect is in the trenches and is flush with the dielectric surface.

Figure 7:
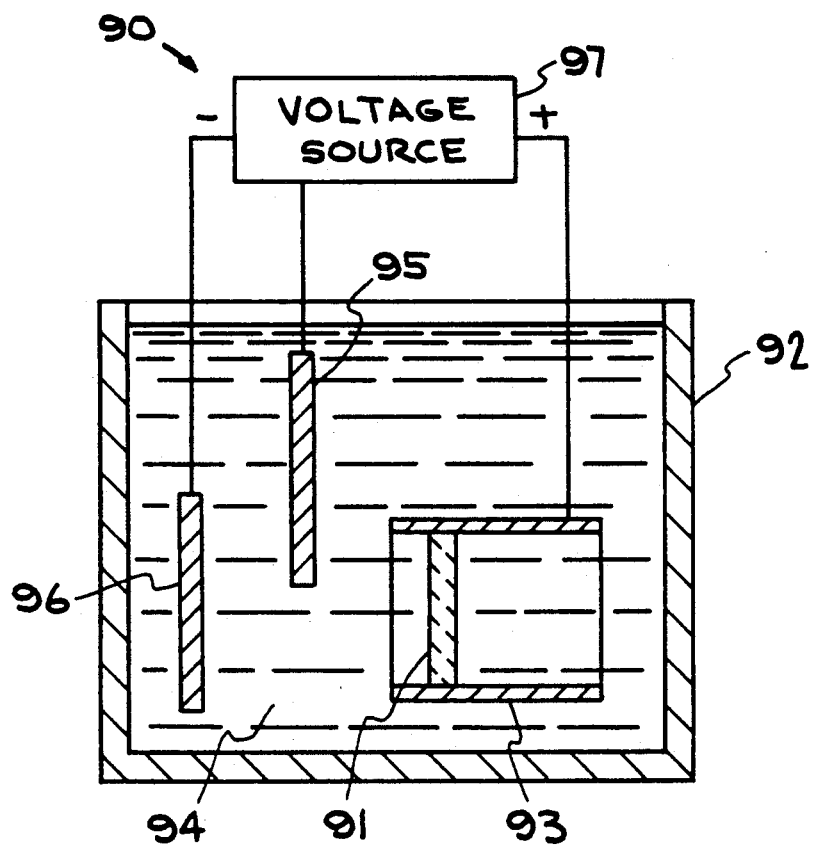
FIG. 7 illustrates a preferred electropolishing apparatus for performing etchback of planarized metal layers on a wafer.

A preferred electropolishing apparatus 90 for carrying out the etchback of planarized metal layers on a wafer is illustrated in FIG. 7. A wafer 91 is placed in an anode conducting cylinder 93 (which does not react with electropolishing solution) in the solution tank 92 filled with electropolishing solution (electrolyte) 94. A reference electrode 95 is placed between the anode conducting cylinder 93 and the cathode electrode 96, preferably made of a material to which the electropolishing metal adheres well. The voltage source 97 produces the required current density for the particular metal Experimentally, 75-mm and 100-mm thermally-oxidized silicon wafers were coated with 10 $\mu$m of $SiO_2$ deposited by low-temperature plasma-enhanced chemical vapor deposition (PECVD). The wafers were then patterned with conventional lithographic and plasma etching techniques to form 5 micron deep vertical-walled trenches having varying widths of 6 to 20 microns. A 400 Å-thick adhesion layer of Ti or Cr was sputter-deposited on the oxide followed by a 2000 Å-thick copper "seed" layer.

Figure 5:
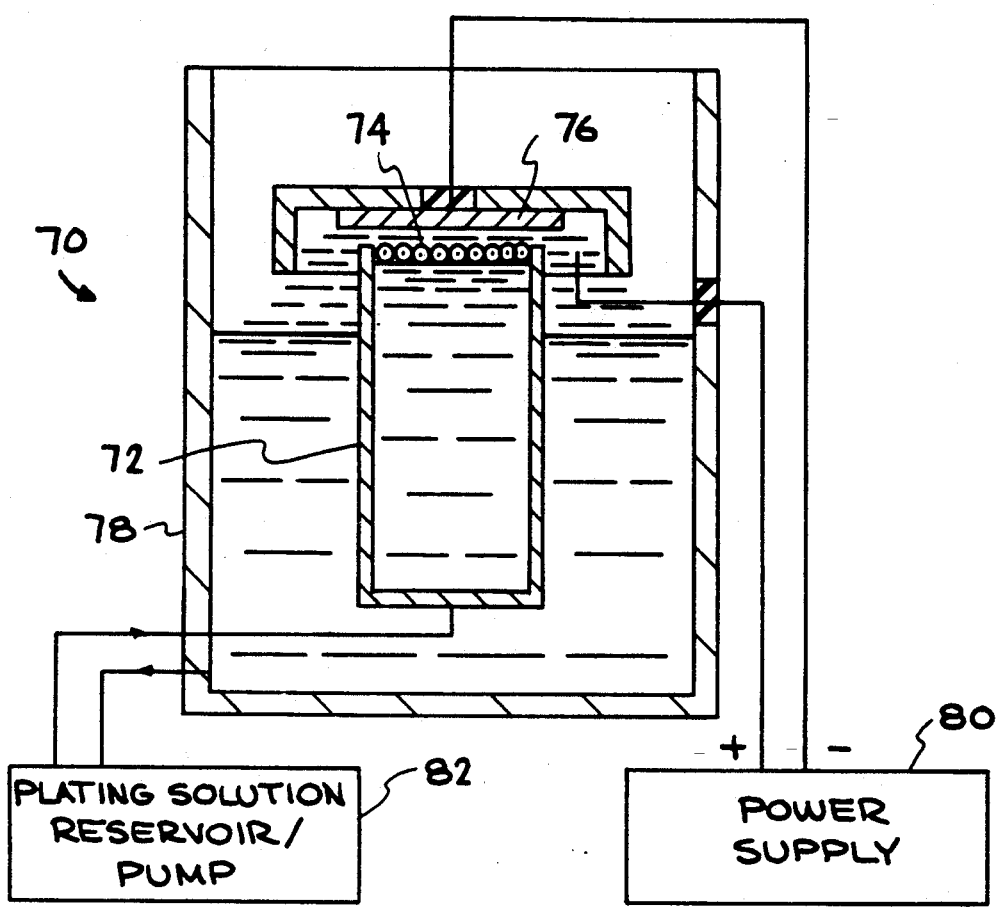
FIG. 5 is a schematic diagram of a flow plating apparatus.

Copper was electroplated from a copper sulphate-sulfuric acid solution using both galvanostatic and pulsed voltage techniques. Average current densities of from 10 to 50 $mA/cm^2$ gave rates from 0.1 to 1 micron/min in a single-wafer high-speed "flow" plating system 70 shown in FIG. 5. The top of the inner tube 72 was capped with a metal anode screen 74 approximately 0.5 cm from the front surface of the plating wafer 76. The plating solution is forced up through a 3.5" diameter glass tube 72, flows radially across the wafer 76 and spills into a large vessel or container 78 which returns the electrolyte to the pump 82. A copper screen 74 stretched across the top of the tube 72 forms the anode while the wafer 76 forms the cathode. The anode and cathode are electrically connected to power supply 80, which is preferably a pulsed supply to produce pulsed plating. The solution had a flow rate of between 40 to 80 liters/min through a 3.5" diameter orifice and overflowed into the larger containment cylinder 78. For both the galvanostatic and pulsed plating the deposition uniformity was ±3% across a 100 mm wafer.

The electroplated copper had a resistivity of 1.8 micro ohm-cm, as measured with a 4-point probe. (Copper bulk resistivity at room temperature is 1.7 micro ohm-cm.)

The excess metal was then removed at rates from 0.25 to 1.0 micron/min by constant-potential electropolishing in a phosphoric acid solution. Best results were achieved when the copper anode plate and cathode (sample) were vertical and facing each other with very little solution movement. The wafer was coaxially mounted in a titanium cylinder which protruded approximately 2 cm in front of the wafer to impede fluid circulation near the wafer edges. A calomel reference electrode was suspended between a copper cathode plate and the wafer anode.

Figure 6:
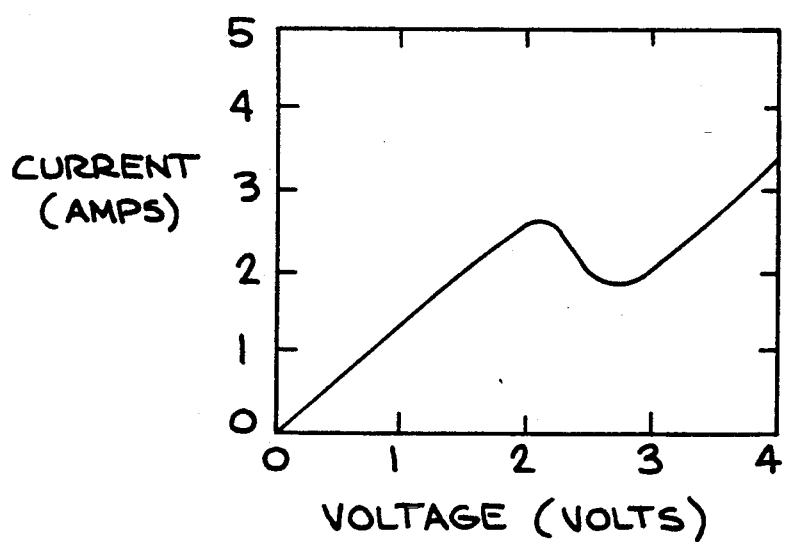
FIG. 6 is a graph of current vs. voltage for copper polishing in phosphoric acid.

FIG. 6 shows the current-voltage curve during a voltage scan from 0 to 4 volts (vs. calomel electrode) of a copper electropolishing cell. Although polishing occurs between 1.2 volts and 4 volts, excessive oxygen bubbling from the anode sample above 2 volts precludes higher voltage electropolishing. Approximately 1.5 volts appears to be optimum for copper electropolishing.

Electropolishing was terminated when the copper first began to clear to prevent rapid overetching of the embedded conductors. The maximum copper thickness remaining on most samples was 0.25 micron. This residual metal was normally removed by ion milling or sputter etching.

At rates of copper deposition from 0.25 to 1.0 micron/min, both galvanostatic and pulsed plating conditions resulted in embedded lines having a 2-3 micron deep cleft in the top surface. However, subsequent electropolishing reduces this depression to less than 0.5 micron, which is sufficient flatness for building up additional circuit layers on top of these buried conductors.

Galvanostatic plating has a tendency to cause voids to be trapped in the center of the plated trench. Pulsed plating techniques prevent formation of voids in the metal layers, and are a preferred plating method.

Electropolishing in a bath, such as in FIG. 3, may result in nonuniform polishing with more polishing at the edges than at the center. One solution is to place the wafer in a tube which prevents or restricts flow against the face of the wafer. Another solution is to spin or rotate the wafer.

Planarization is desirable to form thick multilevel metal interconnects of high integrity. Performing the etchback by electropolishing reduces processing time from hours to minutes.

Changes and modifications in the specifically described embodiments can be carried out without departing from the scope of the invention which is intended to be limited only by the scope of the appended claims.

We claim:

1. Method of forming a planarized thin film metal interconnect in a dielectric layer on a substrate, comprising:

forming a trench or via in the dielectric layer for the metal interconnect;

forming on the dielectric layer a metal layer with a substantially flat surface which fills the trench or via without voids and extends substantially flat over the surface overlying both the trench or via and the surrounding dielectric layer by substantially isotropically depositing by electroplating or electroless plating on the dielectric layer a metal layer in sufficient depth to create said flat surface;

etching back by electropolishing the flat metal layer to the dielectric layer to form a substantially flat surface of metal embedded in and flush with the dielectric layer.

2. The method of claim 1 wherein the trench or via is formed in the dielectric layer by etching.

3. The method of claim 1 further comprising forming the metal layer of gold, silver, copper, aluminum, nickel, zinc or chromium.

4. The method of claim 1 wherein the metal layer is deposited by pulsed plating.

5. The method of claim 1 wherein the etching back by electropolishing is performed by:

connecting the substrate to the anode of a DC voltage source;

placing the substrate in an electrolyte;

flowing a DC current of sufficient current density through the substrate.

6. The method of claim 1 further comprising performing the etching back by electropolishing on a plurality of substrates simultaneously.

7. The method of claim 1 further comprising forming an additional dielectric layer over the etched back metal interconnect and repeating the steps of forming a trench or via, forming a metal layer with a substantially flat surface and etching back the metal layer to form a multilevel interconnect.

8. Method of forming a planarized thin film metal interconnect in a dielectric layer on a substrate, comprising:

forming a trench or via in the dielectric layer for the metal interconnect;

forming on the dielectric layer a metal layer with a substantially flat surface which fills the trench or via without voids and extends substantially flat over the surface overlying both the trench or via and the surrounding dielectric layer by substantially isotropically depositing by electroplating or electroless plating on the dielectric layer a metal layer to a depth of about half the width of the widest trench or via formed in the dielectric layer which is to be filled with metal to create said flat surface;

etching back by electropolishing the flat metal layer to the dielectric layer to form a substantially flat surface of metal embedded in and flush with the dielectric layer.

9. The method of claim 1 further comprising stopping electropolishing just before all metal is totally removed from the dielectric layer and then removing any residual metal by ion milling.

10. Method of forming a planarized thin film metal interconnect in a dielectric layer on a substrate, comprising:

forming a trench or via in the dielectric layer for the metal interconnect;

forming a seed bilayer on the dielectric layer, the seed bilayer comprising a bottom layer of conducting material on which electroplating and electropolishing do not occur and a top layer of another conducting material on which electropolishing and electroplating do occur;

forming on the dielectric layer a metal layer with a substantially flat surface which fills the trench or via without voids and extends substantially flat over the surface overlying both the trench or via and the surrounding dielectric layer by substantially isotropically depositing by electroplating or electroless plating on the top layer of the seed bilayer a metal layer in sufficient depth of create said flat surface;

etching back by electropolishing the flat metal layer to the bottom layer of the seed bilayer on the dielectric layer outside the trench or via to form a substantially flat surface of metal embedded in and flush with the dielectric layer;

removing the bottom layer of the seed bilayer on the dielectric layer outside the trench or via.

11. The method of claim 1 further comprising rotating the substrate while electropolishing to provide more uniform electropolishing.

12. The method of claim 1 further comprising placing the substrate in a tube which restricts flow against the face of the substrate while electropolishing to provide more uniform electropolishing.

* * * * *